US009431079B1

United States Patent
Shu et al.

(10) Patent No.: US 9,431,079 B1
(45) Date of Patent: Aug. 30, 2016

(54) SYSTEMS AND METHODS OF MEMORY AND MEMORY OPERATION INVOLVING INPUT LATCHING, SELF-TIMING AND/OR OTHER FEATURES

(71) Applicant: GSI TECHNOLOGY, INC., Sunnyvale, CA (US)

(72) Inventors: Leelean Shu, Los Altos, CA (US); Yoshi Sato, San Jose, CA (US); Hsin You S. Lee, Campbell, CA (US)

(73) Assignee: GSI Technology, Inc., Sunnyvale, CA (US)

( * ) Notice: Subject to any disclaimer, the term of this patent is extended or adjusted under 35 U.S.C. 154(b) by 0 days.

(21) Appl. No.: 14/105,133

(22) Filed: Dec. 12, 2013

Related U.S. Application Data

(60) Provisional application No. 61/737,067, filed on Dec. 13, 2012.

(51) Int. Cl.
   G11C 7/10 (2006.01)

(52) U.S. Cl.
   CPC .............. G11C 7/1087 (2013.01); G11C 7/109 (2013.01)

(58) Field of Classification Search
   CPC ...................... G06K 7/10366; G06K 19/0712; G06K 19/0723; G06K 7/0008; G06K 15/02; G06K 19/07309; G06K 2009/00738; G06K 7/084; G06K 7/10009; G06K 7/1092; G06K 9/00342; G06K 9/00711; G11C 7/222; G11C 7/1072; G11C 11/4076; G11C 11/418; G11C 11/419; G11C 13/0023; G11C 13/0069; G11C 16/06; G11C 16/32; G11C 29/023
   USPC .......... 365/189.05, 189.011, 189.14, 189.08, 365/189.12, 230.01
   See application file for complete search history.

(56) References Cited

U.S. PATENT DOCUMENTS

| | | | |
|---|---|---|---|
| 5,295,115 A | 3/1994 | Furuya et al. | |
| 5,327,390 A | 7/1994 | Takasugi | |
| 5,493,530 A | 2/1996 | Lee et al. | |
| 5,841,732 A | 11/1998 | Mick | |
| 5,864,252 A | 1/1999 | Tran et al. | |
| 5,898,331 A | 4/1999 | Fujita | |
| 7,113,446 B2 | 9/2006 | Fujisawa | |
| 7,142,477 B1 | 11/2006 | Tran et al. | |
| 8,737,160 B2 * | 5/2014 | Hayashi | ..................... 365/233.1 |
| 9,159,391 B1 | 10/2015 | Shu | |
| 2003/0065900 A1 | 4/2003 | Mes | |
| 2005/0141333 A1 * | 6/2005 | Fujisawa | ........................ 365/233 |
| 2009/0016120 A1 * | 1/2009 | Kinoshita et al. | ....... 365/189.05 |

OTHER PUBLICATIONS

Image File History of U.S. Appl. No. 14/105,124, filed Dec. 12, 2013.
Image File History of U.S. Appl. No. 14/881,098, filed Oct. 12, 2015.
U.S. Appl. No. 14/881,098, filed Oct. 12, 2015, pending.

* cited by examiner

*Primary Examiner* — Fernando Hidalgo
(74) *Attorney, Agent, or Firm* — DLA Piper LLP (US)

(57) ABSTRACT

Systems and methods relating to memory and/or memory latching are disclosed. In one exemplary implementation, an illustrative memory device may include self-timed pulse generator circuitry, first input latch circuitry, read/write control circuitry, and second input latch circuitry. According to further implementations herein, fast address access for read and write may be provided in the same cycle via a self-timed pulse in the input latch circuit and/or via associated control/scheme from control circuitry.

12 Claims, 8 Drawing Sheets

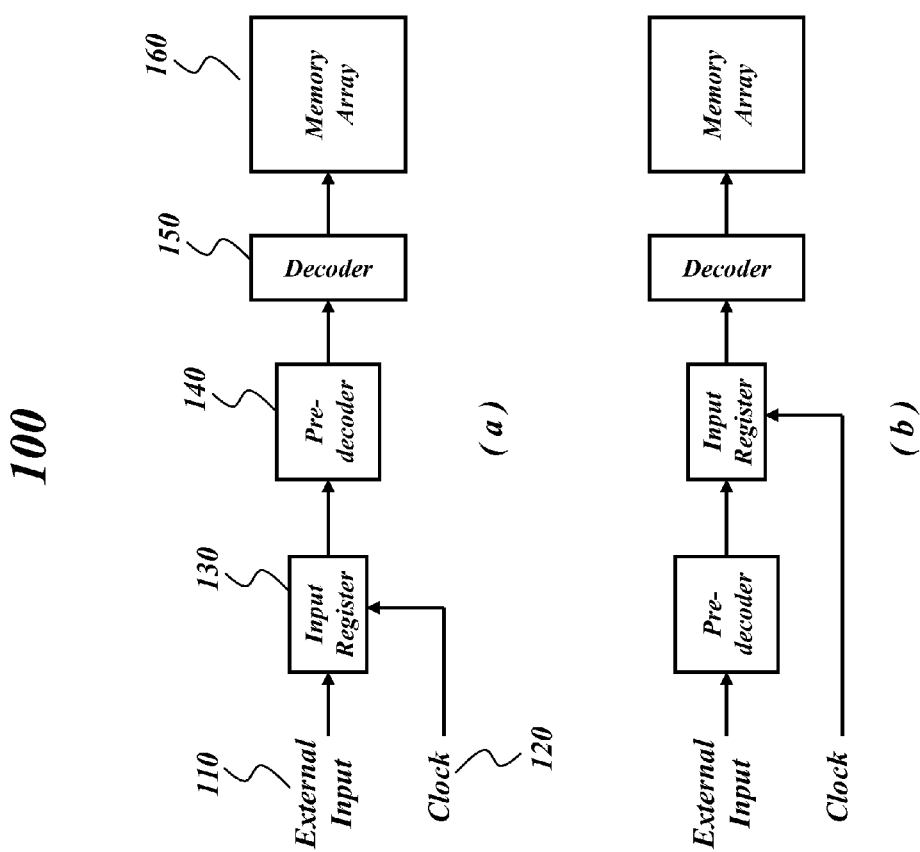
Figure 1: Prior Art

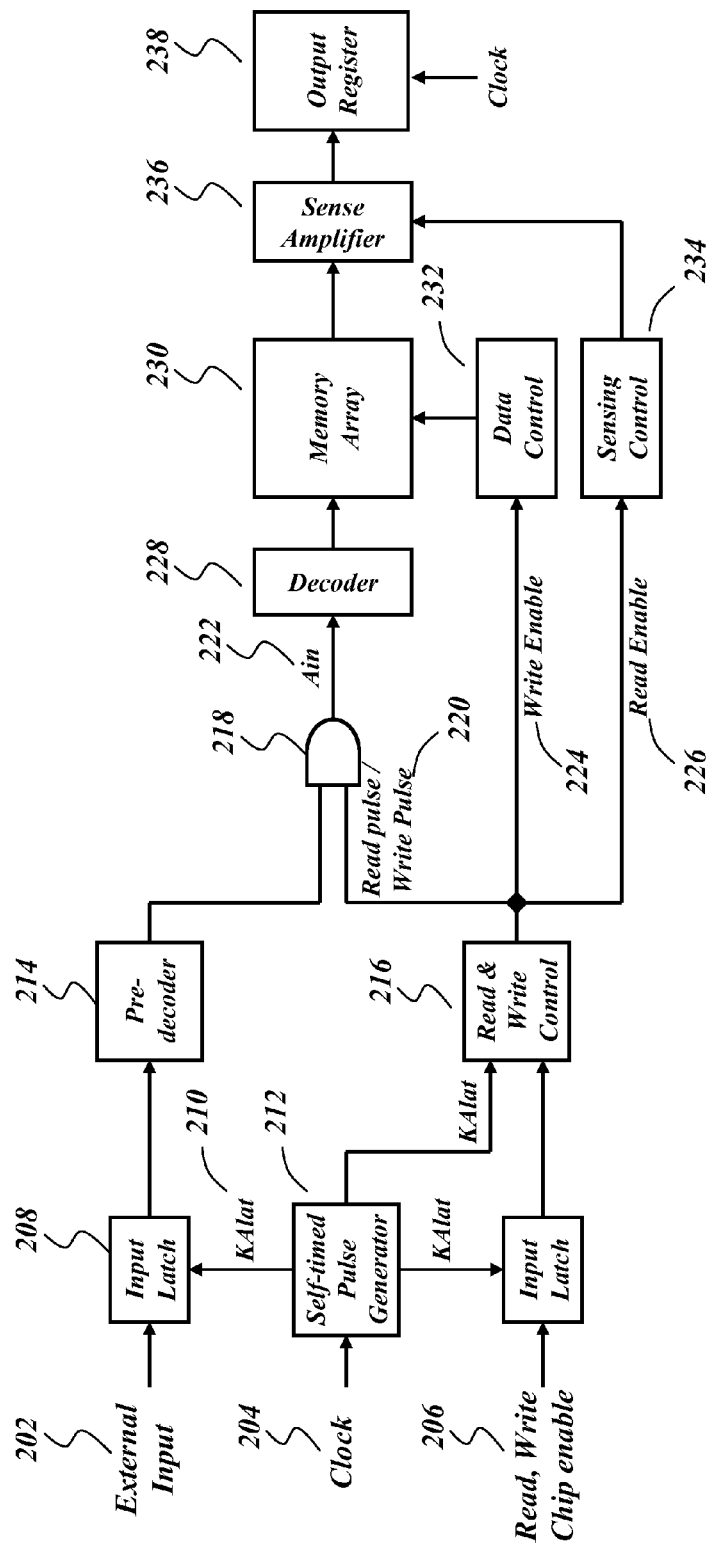
Figure 2: Block Diagram of Self-timed Input Latch Synchronous Memory

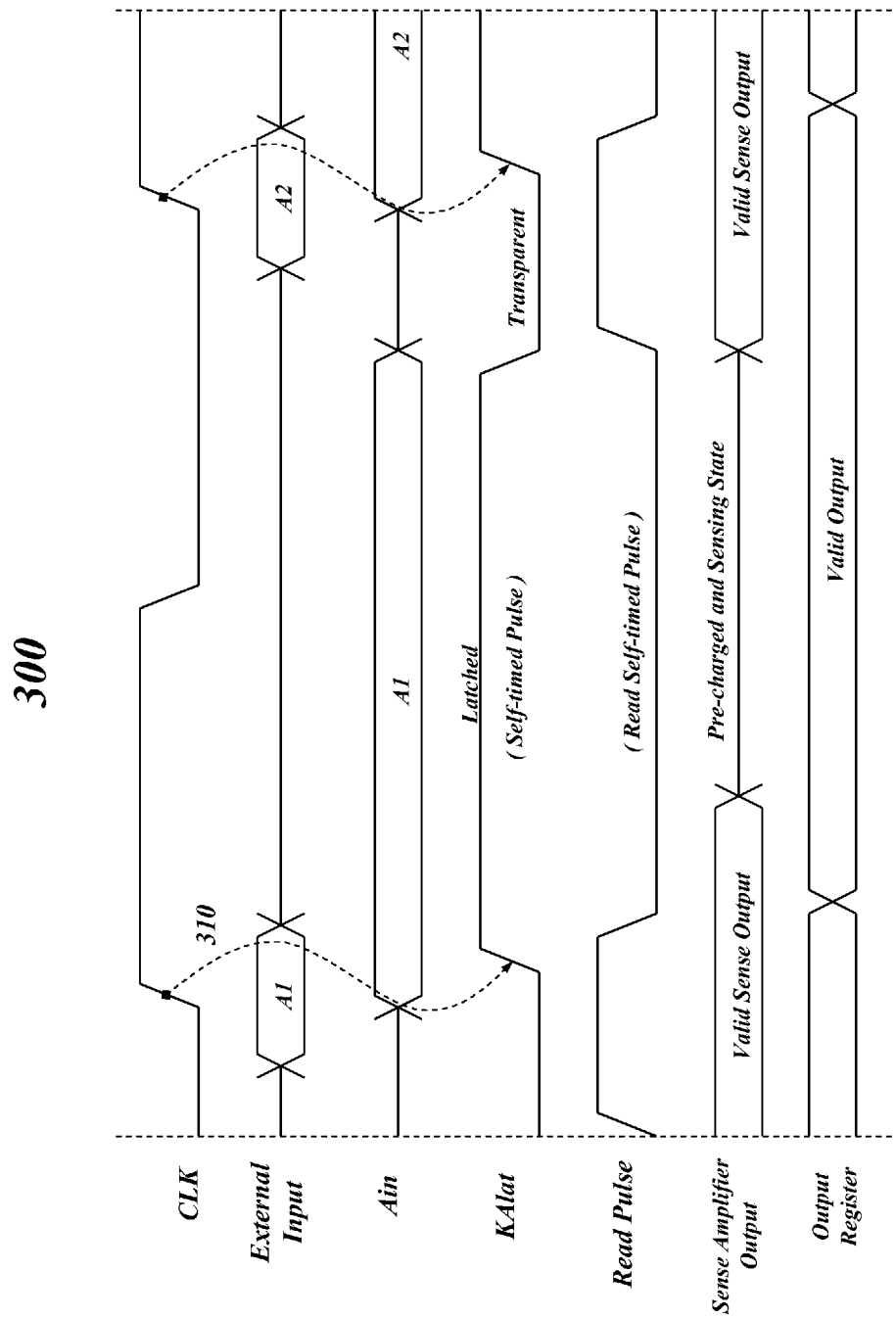
Figure 3: Timing Diagram of Self-timed Input Latch in Read Operation

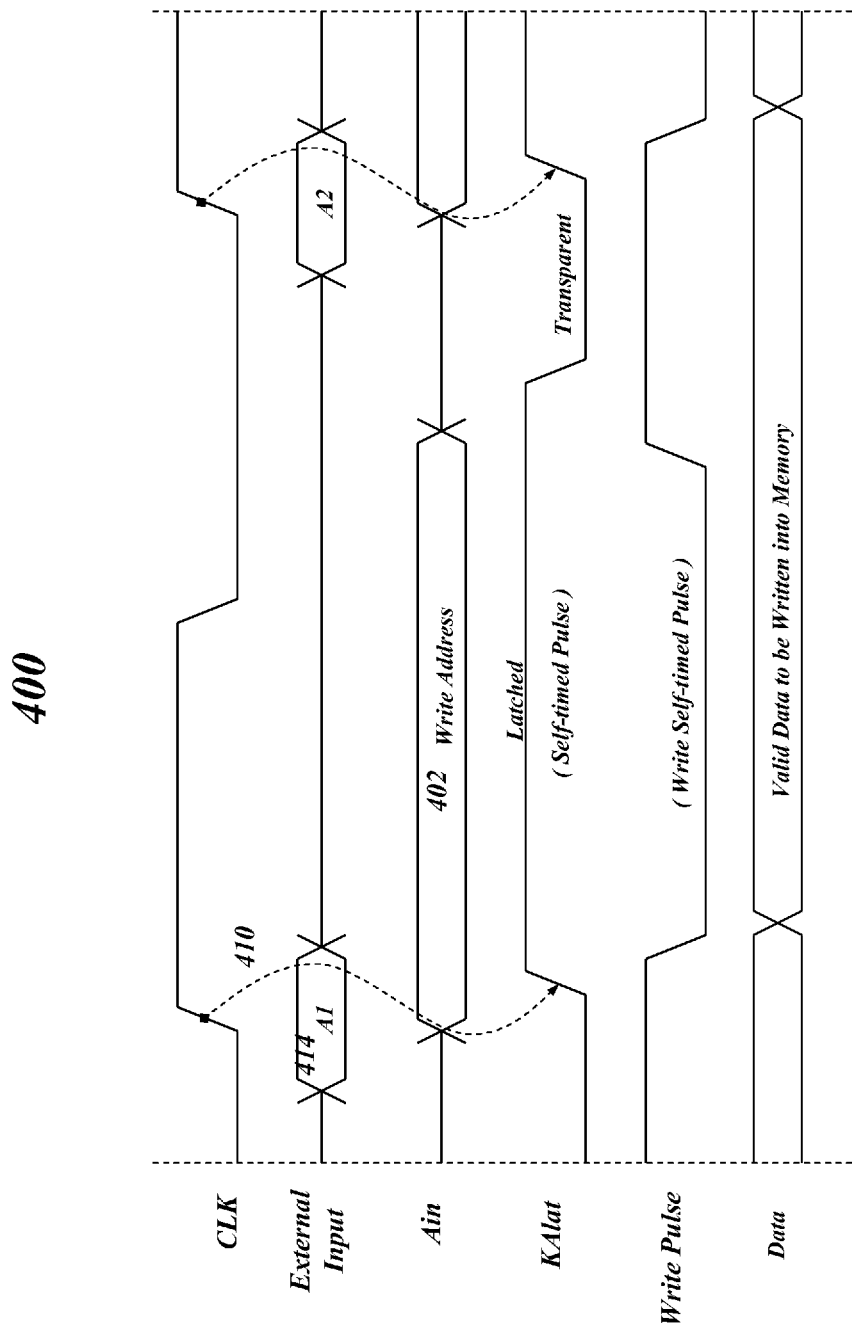
Figure 4: Timing Diagram of Self-timed Input Latch in Write Operation

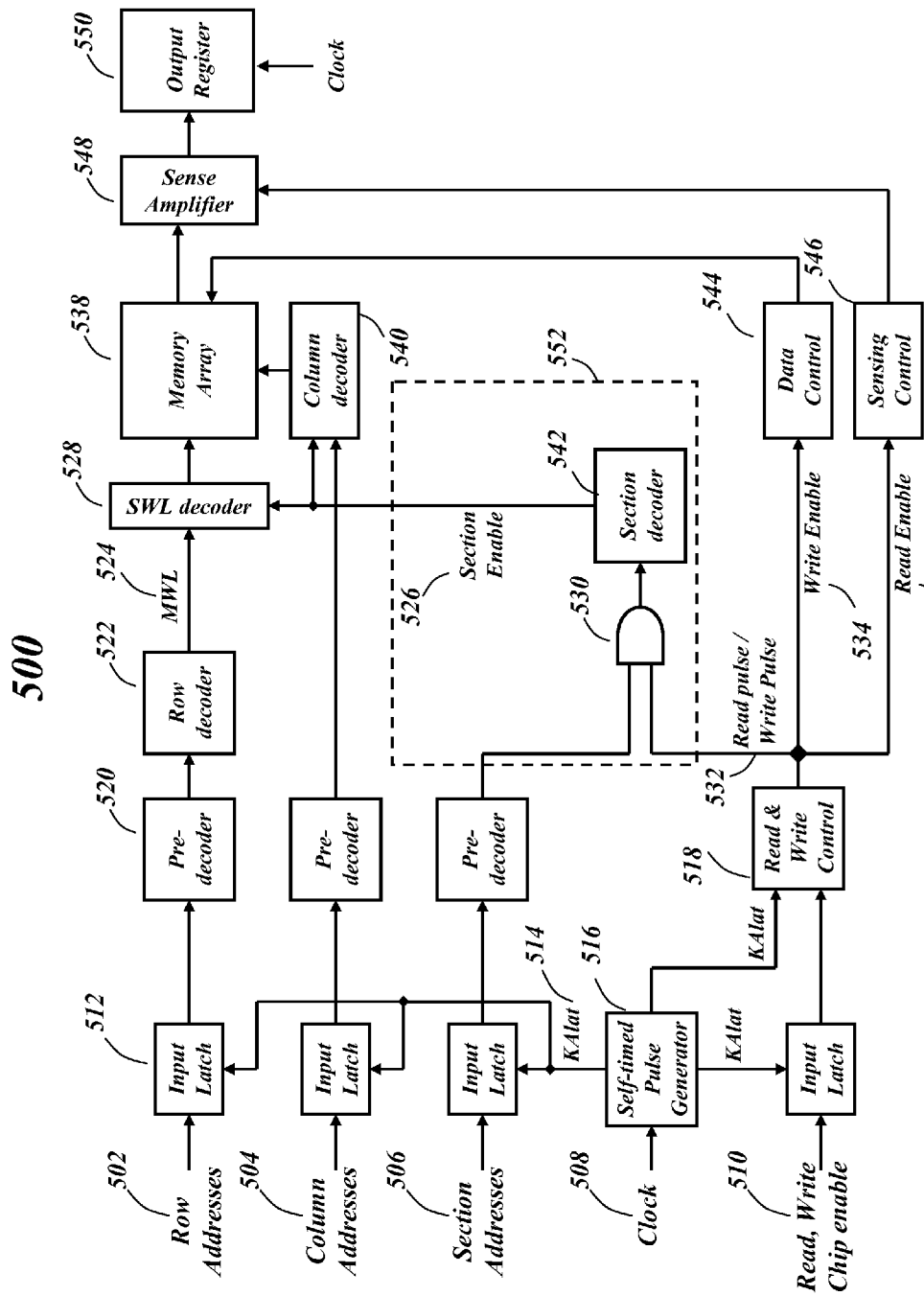
Figure 5: Example of Self-timed Input and Synchronous Memory

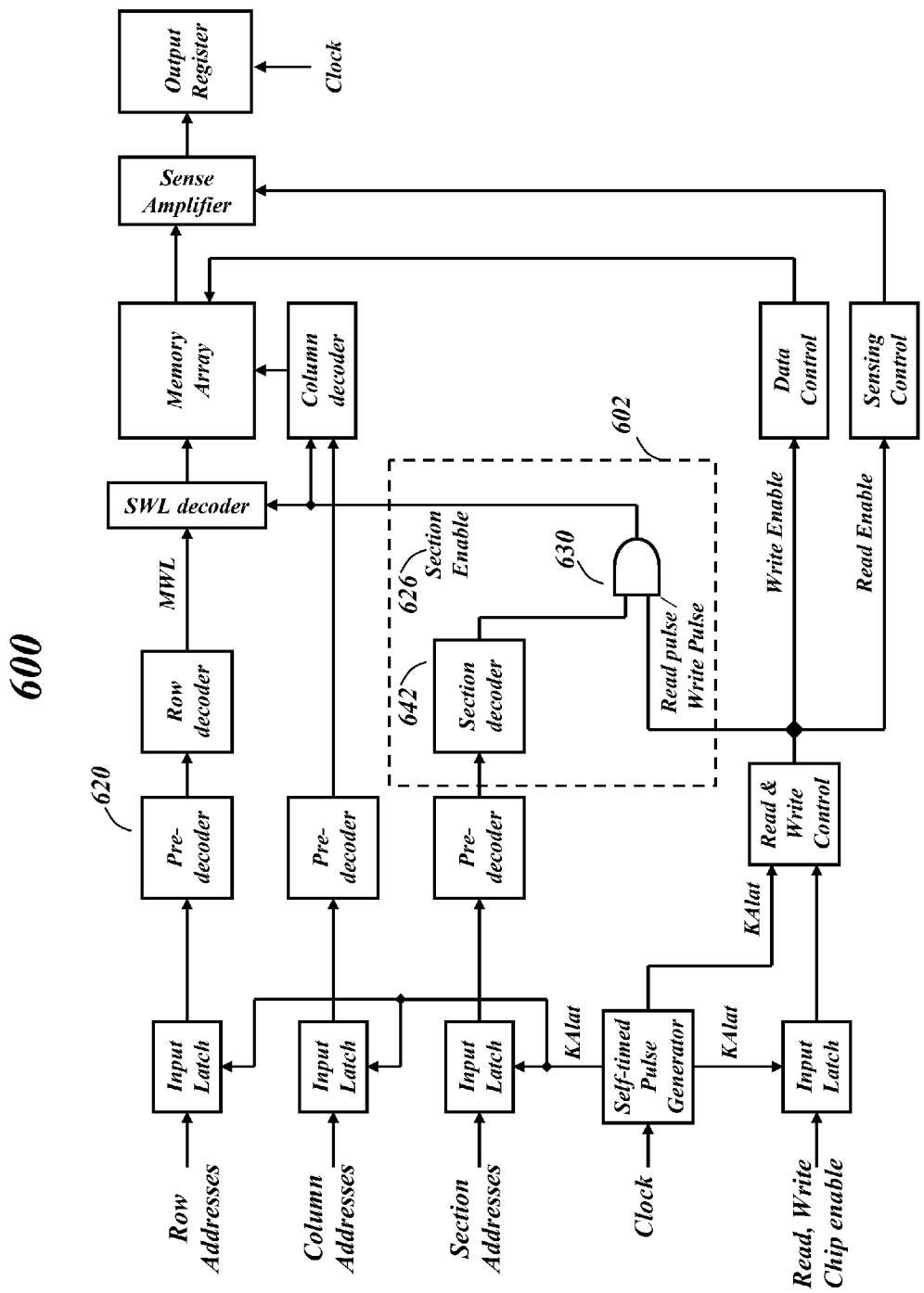

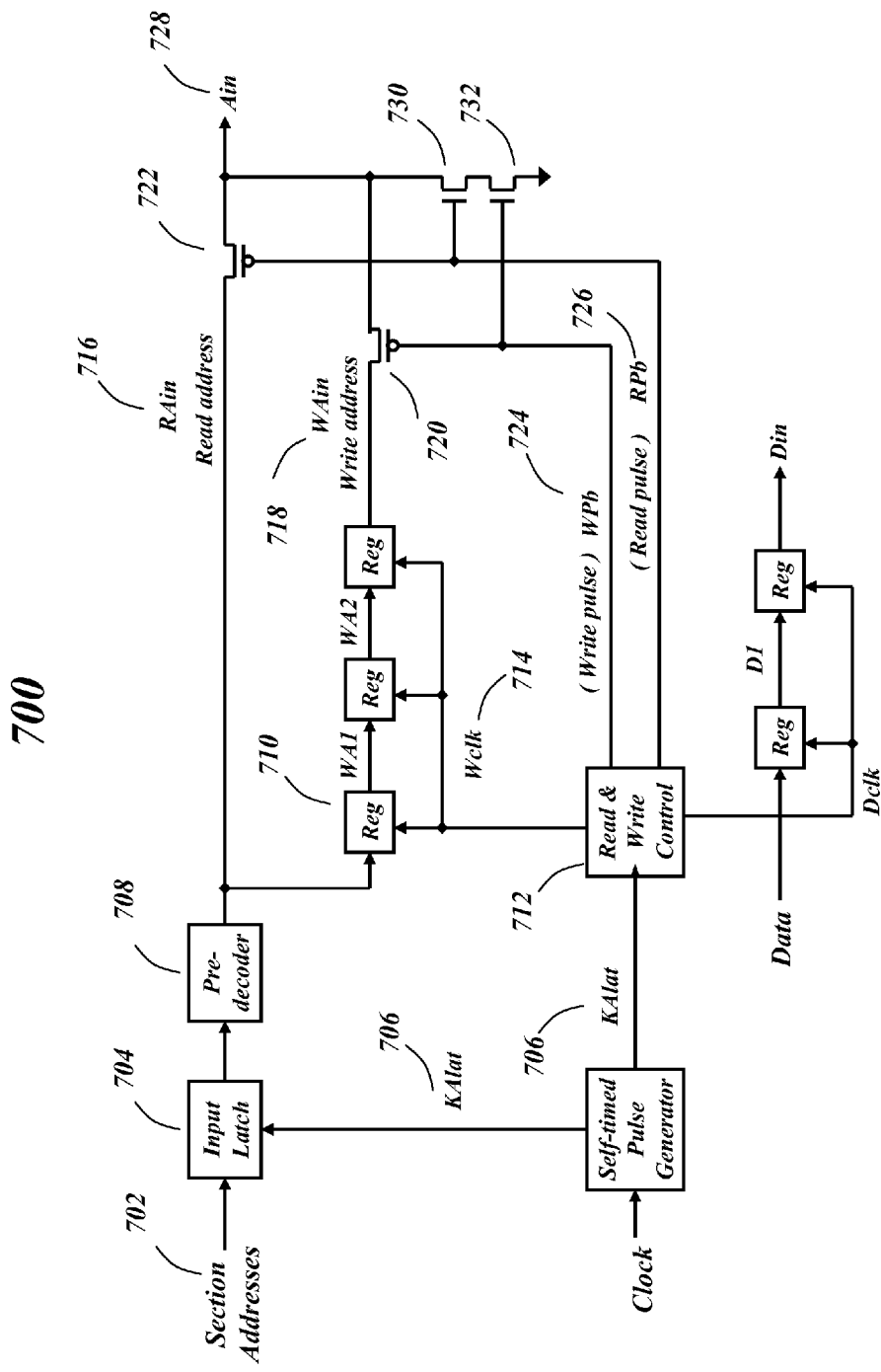
Figure 7: Read and Write Address Path of Self-timed Input Latch Synchronous Memory

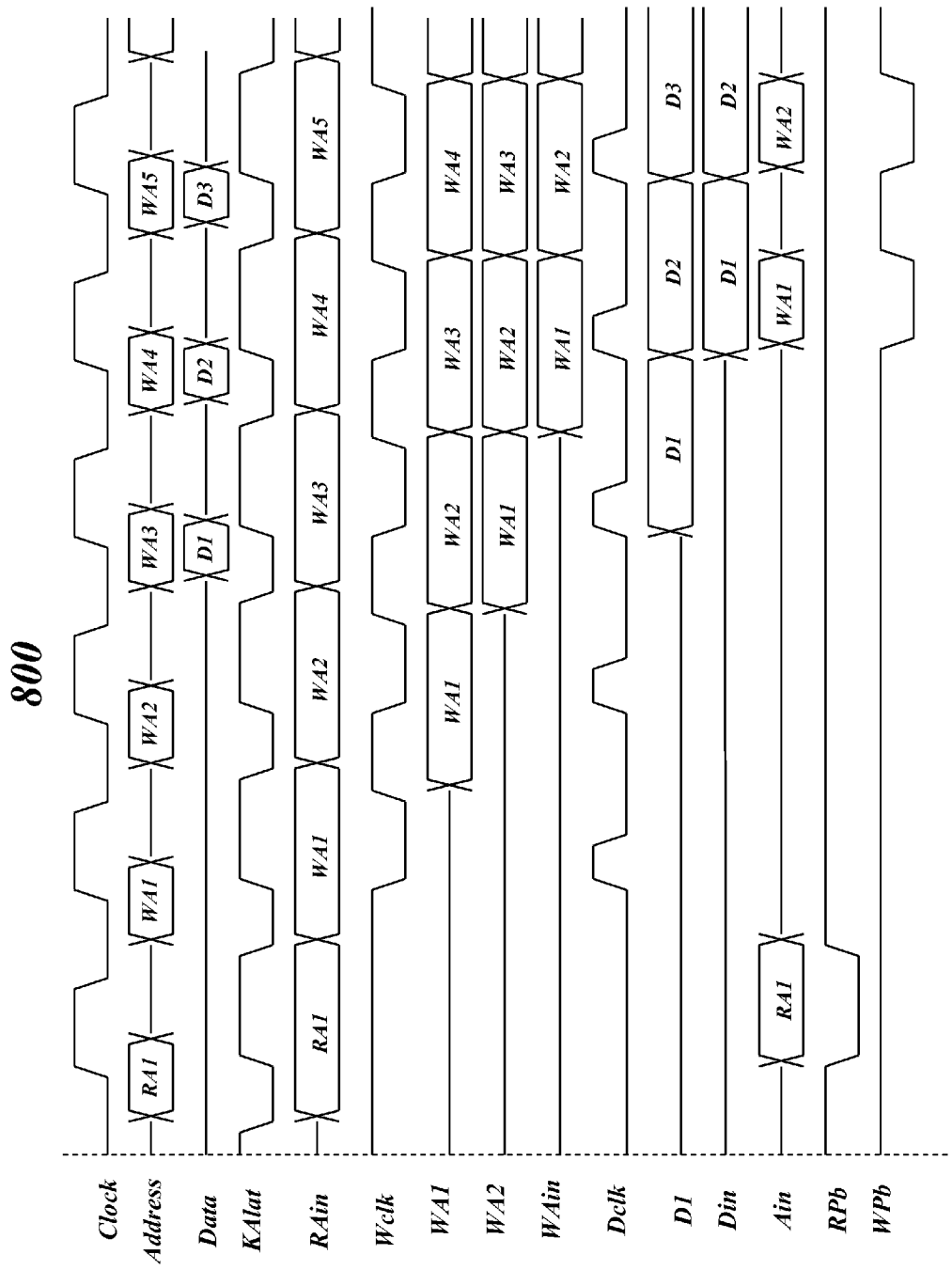
Figure 8: Timing Diagram of Read, Write addresses and Write Data

SYSTEMS AND METHODS OF MEMORY AND MEMORY OPERATION INVOLVING INPUT LATCHING, SELF-TIMING AND/OR OTHER FEATURES

CROSS-REFERENCE TO RELATED APPLICATION

This application claims benefit/priority of provisional application No. 61/737,067, filed Dec. 13, 2012, which is incorporated herein by reference in entirety.

BACKGROUND

1. Field

Innovations herein relate generally to memory and/or memory latching and, more specifically, to systems and methods of memory and memory operation, such as fast address access to improve random access time and/or minimize cycle time.

2. Description of Related Information

In many existing memory circuits, inputs are registered by a clock in the SRAM. Thus, for proper operation, all the read or write operations should occur after the rising edge of a clock. For synchronous operation, then, there must be a setup time and hold time to ensure that an input is properly registered. Here, the usage of setup time is only pertinent to the input register. FIG. 1A is a block diagram of an existing memory circuit 100. External input 110 and clock 120 signals are fed into an input register 130. The output of the input register 130 can be fed into a pre-decoder 140 which in turn supplies a signal to a decoder 150, which in turn supplies a signal to a memory array 160. FIG. 1B is a block diagram of another prior art memory circuit 100. In this embodiment, an external input 110 is first supplied to a pre-decoder 140. The output of the pre-decoder 140 and a clock 120 are supplied to an input register 130 which in turn supplies a signal to a decoder 150, which in turn supplies a signal to a memory array 160. In both cases, an input register 130 is needed to ensure synchronous memory circuit operation.

However, there is a need for systems and methods that provide for fast address access for read and write in the same cycle and/or other advantages over such existing circuitry.

BRIEF DESCRIPTION OF THE DRAWINGS

The accompanying drawings, which constitute a part of this specification, illustrate various implementations and features of the present inventions and, together with the description, help explain aspects of the innovations herein. In the drawings:

FIG. 1A is a block diagram of a known memory circuit.

FIG. 1B is a block diagram of a known memory circuit.

FIG. 2 is a block diagram of an illustrative memory circuit consistent with certain aspects related to the innovations herein.

FIG. 3 is a timing diagram for an illustrative memory circuit consistent with certain aspects related to the innovations herein.

FIG. 4 is a timing diagram for an illustrative memory circuit consistent with certain aspects related to the innovations herein.

FIG. 5 is a block diagram of another memory circuit consistent with certain aspects related to the innovations herein.

FIG. 6 is a block diagram of another memory circuit consistent with certain aspects related to the innovations herein.

FIG. 7 is a block diagram of another memory circuit consistent with certain aspects related to the innovations herein.

FIG. 8 is an illustrative timing diagram for an exemplary memory circuit consistent with certain aspects related to the innovations herein.

DETAILED DESCRIPTION OF ILLUSTRATIVE IMPLEMENTATIONS

Reference will now be made in detail to the inventions herein, examples of which are illustrated in the accompanying drawings. The implementations set forth in the following description do not represent all implementations consistent with the claimed inventions. Instead, they are merely some examples consistent with certain aspects related to the present innovations. Wherever possible, the same reference numbers will be used throughout the drawings to refer to the same or like parts.

Some innovations herein relate generally to memory and/or memory latching, such as systems and methods involving fast address access, self-timed pulse input latch circuitry/scheme(s), improved random access time, minimized cycle time, and/or other features.

FIG. 2 is a block diagram of a memory circuit according to certain implementations of the innovations herein. Referring to FIG. 2, elements for generating a self-timed input latch may include input latches 208, pre-decoders 214, a self-timed pulse generator 212, and/or a read and write control 216. A self-timed input latch generated by such elements may be utilized beyond the specific example shown. In this example, it is used for memory operations by a decoder 228, memory array 230, sense amplifier 236, and output register 238, although such self-timed input latch may be used with other memory configurations or circuitry. While data control 232 and sensing control 234 elements are represented, such elements are not part of the latching block(s) but are shown to provide an overall picture of a memory system with a self-timed input latch. Signals shown in timing diagrams herein are not necessarily related to any such elements except the data inputs.

Consistent with the implementations of FIG. 2 and elsewhere herein, the present systems and methods may utilize the input setup time to substantially reduce or eliminate delays and complete some front-end tasks. Some implementations may, for example, reduce or eliminate delays from input buffers, transmit a signal through a distance inside of a chip, and/or perform pre-decoding tasks. To provide fast address access, the input latch may be in the transparent state before a next clock rising edge. In some implementations fast address access for read and/or write operations may even be enabled by utilizing a self-timed pulse input latch scheme.

FIGS. 3-4 are timing diagrams for a memory circuit according to implementations of the present innovations. FIG. 3 is a timing diagram for a read operation 300, and FIG. 4 is a timing diagram for a write operation 400. At the beginning of a cycle, the clock 204 rising edge may create a positive self-timed pulse KAlat 210 through the self-timed pulse generator 212. The polarity of the input latch self-timed pulse can be positive or negative. In the examples of FIGS. 3-4 a positive pulse is shown. At the rising edge of KAlat 210, the input latch may be changed to the latched state. Thus, the internal signal Ain 222, for the read address in the read operation 300 and/or for the write address in the write operation 400, may be unaffected by external signals and may remained unchanged during the KAlat 210 self-timed pulse, as shown in FIGS. 3-4. The write address may be registered in the register after input latch, as seen in FIG. 7 below. The write address 402 shown in FIG. 4 may be from the write register, not from the current write cycle address 414. Ain 222 may be synchronized to the rising edge of clock 204. The read pulse 220 and/or the write pulse 220 may be derived from KAlat 210, the input latch signal. Emulation of array timing and/or feedbacks from the array may be used to determine the read pulse 220 and/or write pulse 220 width, for example. At the end of the KAlat 210 pulse, all input latches may be changed from a latched state to a transparent state to allow for acceptance of the next cycle input information. Further, the internal read pulse 220 and write pulse 220 may be independent of cycle time and independent of clock edges.

FIG. 5 is a block diagram of another memory circuit according to aspects of the innovations herein. Referring to FIG. 5, an illustrative self-timed latching of FIG. 2 is shown in more detail. Elements for generating a self-timed input latch may include input latches 512, pre-decoders 520, a self-timed pulse generator 516, and/or a read and write control 518. A self-timed input latch generated by these elements may be used for any purpose. In this example, it may be used for memory operations involving a section decoder 542 and data control 544 and sensing control 546 for memory array 538 access operations, although those of ordinary skill in the art will recognize that a self-timed input latch may be used with other memory configurations or circuits. While one circuit arrangement including section decoding circuitry 552 is shown, other configurations are possible as set forth in more detail below. Elements in FIG. 5 may, in certain implementations, function consonantly as comparable elements in FIG. 2, and hence, for such implementations, aspects of the waveforms in FIGS. 3 and 4 may be applicable to the block diagram of FIG. 5. The various control signals and the corresponding timing and waveforms in FIG. 5 may be consonant with those of the implementations shown in FIG. 2.

Here, schemes of re-synchronizing are shown in FIG. 5 via utilization of section enable pulse and/or associated circuitry. The row and column addresses are pre-decoded and stand by waiting for section enable pulse. The row and column addresses are not controlled or constrained by signals/inputs such as a read pulse and/or clock, thus the row and column addresses may be considered as asynchronous. As such, in some implementations, the row and column addresses are required to be synchronized at some point after the input transparent latch. High density memory arrays may be sub-divided into smaller arrays to improve speed and to reduce power. A smaller array may be called a section. In each section, there may be a word line decoder, column decoder, sense amplifier, data driver, and all other circuits used to perform the read and write operations of the memory cell. Consistent with implementations herein, a section may be a location where re-synchronizing of the word line decoding and column decoding is performed. Further, the row and column decoded signals may be DC signals within a cycle time, which may reduce power consumption, according to various implementations herein. According to certain implementations herein, only the section signal is combined with R/W pulse to create a section read enable pulse or section write enable pulse. With the section enable pulse, the section word line (SWL) and section column may be synchronized locally, and other control signals may also be synchronized locally. Examples of combining of section signal and R/W pulse are shown in the illustrative implementations of FIG. 5 and FIG. 7. At completion of either read or write pulse, all the Ain of section addresses may be pulled to logic low by NMOS transistors (see, e.g., transistors 730 and 732 in FIG. 7), thus disabling all decoders in all the sections.

FIG. 6 is a block diagram of another memory circuit according to aspects of the innovations herein. The diagram of FIG. 6 is similar to that of FIG. 5, although another exemplary implementation of section decoding circuitry 602 is shown. In the circuitry 602 shown in FIG. 6, for example, a section decoder 642 may be provided at an input of a gate 630 which also receives read pulses and/or write pulses 632 as inputs, instead of at the output of such a gate as shown in FIG. 5. Those of ordinary skill in the art will appreciate that circuits herein may function similarly in spite of different decoder 642 positioning and that implementations are not limited to any specific circuitry. In some embodiments, other circuit layout changes may also be possible without changing the features/functionality of the memory circuits described herein. Two example configurations are shown for illustration, but others are within the ambit of the innovations herein.

FIG. 7 is a block diagram of yet another memory circuit 700 consistent with certain aspects related to the innovations herein. Referring to FIG. 7, a read and write path of a self-timed input latch memory circuit may include an input latch 704, pre-decoder 708, registers 710, read and write control 712, self-timed pulse generator 734, and/or switches 720, 722, 730, 732. Implementations consistent with FIG. 7 may operate in consonant way as the circuits of FIGS. 5-6 described above. For example, input latch 704, self-timed pulse generator 734, pre-decoder 708, and read and write control 712 may be consonant with the elements shown in FIG. 5. Registers 710 and switches 720, 722, 730, 732 may provide switching between the read and write section addresses, as illustrated below with respect to FIG. 8.

FIG. 8 is a timing diagram 800 for an illustrative memory circuit consistent with certain aspects related to the innovations herein. For example, the timings in FIG. 8 may be related to the circuit of FIG. 7. In FIG. 8, a detailed example of how read and write section address is transmitted into memory array with the data path that is associated to the write address path is shown. The number of registers in the write address and data path depends on the particular SRAM protocol. For illustration purpose, the zero bus turn-around SRAM protocol is used. In FIG. 8, the self-timed pulse KAlat latches the read and write section address. With the read pulse (RPb) and write pulse (WPb), the proper read and write addresses are transmitted into the memory array. KAlat, RPb, and WPb are all self-timed pulses. The registers in the write path and the data path may align write address and data at a later write cycle. For example, the registers may provide alignment of WA1 and D1 as well as WA2 and D2.

Turning back to other aspects as associated with e.g., FIGS. 2, 5 and 7, innovations herein may involve the fact that row and column decoded signal may be DC signals and/or operation features thereof. For example, all of the row and column data may be read straight into the memory, e.g., without having any delay or control associated with read pulses. As such, this data may be waiting at the memory for the section data to complete. With regard to completion/use of section data, section data/signal(s) may be utilized for control and/or synchronization of memory operations and/or transfer of clock pulses into/inside the array, according to implementations herein. Among other things, reduction of power consumption may be achieved because no control elements may need to be switched on and/or off to make the data available at the memory for read. Further, in some implementations, row and column functionality such as addressing may involve no clock, as the clock signal may only be involved in the section logic. This may provide power savings for such implementations. Moreover, implementations herein may be configured such that chip addresses/addressing may be 'partially synchronized', e.g., meaning that only some but not all of the chip addressing may be synchronized, which may enable fast operation, power saving, and/or reduced complexity over some other synchronized addressing regimes.

In high density memory arrays, signals may be inherently skew prone because of having to traverse large distances and multiple decoding. Signal skew may affect the random access time and cycle time in a pulse word line memory design. Consistent with the innovations herein, some or all signal skews may be masked by taking advantage of setup time. By making use of setup time enabled by the transparency of input latch, all word line and column information may be transmitted to the section ahead of section enable pulse. Thus, the signal skews due to the location, distance difference, and variation in pre-decoding speed due to the random input patterns may be substantially eliminated in the section. This may also enable high density array design of a simplified nature.

Further, consistent with the self-timed transparent input latch features herein, faster address access may allow reduction of random access time of a memory array, thus resulting in a faster cycle time. With the self-timed pulse latch, a useful setup and hold time window can also be obtained.

According to the innovations described herein, memory devices (e.g., semiconductor memory devices) may be provided. For example, a semiconductor memory device may comprise a self-timed pulse generator, first input latch circuitry, read/write control circuitry, and/or second input latch circuitry. The self-timed pulse generator may be configured to receive a clock signal and generate a self-timed pulse having a first edge corresponding to a rising edge of the clock signal and a second edge. The first input latch circuitry may be configured to receive the self-timed pulse and a memory operation command and generate an internal memory operation command set to a latched state corresponding to the first edge of the self-timed pulse. The read/write control circuitry may be configured to receive the self-timed pulse and internal memory operation signal and perform a read operation and/or a write operation, the read operation being performed corresponding to one of the first edge or second edge of the self-timed pulse, and/or the write operation being performed corresponding to one of the first edge or second edge of the self-timed pulse. The second input latch circuitry may be configured to receive the self-timed pulse and a memory address and generate an internal address signal set to a latched state corresponding to the first edge of the self-timed pulse. Improved device performance may be provided via a self-timed pulse in the input latch circuitry and/or via associated control/scheme from the control circuit.

In another example, a memory device may comprise a self-timed pulse generator, a first input latch circuit, a read and write control circuit, and/or a second input latch circuit. The self-timed pulse generator may be configured to receive a clock signal and generate a self-timed pulse having a first edge corresponding to a rising edge of the clock signal and a second edge. The first input latch circuit may be configured to receive the self-timed pulse and a memory operation command and generate an internal memory operation command set to a latched state corresponding to the first edge of the self-timed pulse. The read and write control circuit may be configured to receive the self-timed pulse and internal memory operation signal and perform a read operation and/or a write operation, the read operation being performed corresponding to one of the first edge and second edge of the self-timed pulse, and the write operation being performed corresponding to one of the first edge and second edge of the self-timed pulse. The second input latch circuit may be configured to receive the self-timed pulse and a memory address and generate an internal address signal set to a latched state corresponding to the first edge of the self-timed pulse. Write address timing and/or data timing associated with the write operation may be aligned.

In another example, a memory device may comprise self-timed pulse generator circuitry, latching circuitry, and/or read/write control circuitry. The self-timed pulse generator circuitry may be configured to receive a clock signal and generate a self-timed pulse having a first edge corresponding to a rising edge of the clock signal and a second edge. The latching circuitry may be configured to receive the self-timed pulse and a memory operation command and generate an internal memory operation command set to a latched state corresponding to the first edge of the self-timed pulse. The read/write control circuitry may be configured to receive the self-timed pulse and internal memory operation signal and perform a read operation and/or a write operation, the read operation being performed corresponding to one of the first edge or second edge of the self-timed pulse, and/or the write operation being performed corresponding to one of the first edge or second edge of the self-timed pulse.

In embodiments based on any of the aforementioned examples, or in other embodiments, additional features may be provided. Improved performance provided by such memory devices may include one or more of fast address access, improved random access time, and/or minimized cycle time. One or both of the read operation may comprise generating a read self-timed pulse, and/or the write operation may comprise generating a write self-timed pulse. The first input latch circuit may be further configured to enter an unlatched state at a time corresponding to the second edge of the self-timed pulse, and the second input latch circuit may be further configured to enter an unlatched state at a time corresponding to the second edge of the self-timed pulse. Control to transmit row and column data into memory may be provided via the section address logic. The registers and/or circuitry may be arranged to provide a simplified configuration that aids memory array design. The registers and circuitry may be arranged to provide consistent read operation. As a function of the arrangement/configuration, data flow associated with (into and out of) the memory may be the same for read and write. The self-timed pulse generator may be configured to generate a read self-timed pulse and a write self-timed pulse characterized in that a read self-timed pulse (RPb) is provided to the section address logic as a function of the KAlat signal, the input latch signal, and a read control signal. A KAlat self-timed pulse width may be determined to ensure the completion of read operations. Emulation of array timing and/or feedbacks from the array may be used to determine the self-timed pulse width. At the end of the KAlat pulse, all input latches may be changed from a latched state to a transparent state to allow for acceptance of the next cycle input information. Write address timing and/or data timing associated with the write operation may be aligned.

Memory devices may further comprise a plurality of second input latch circuits configured to receive the self-timed pulse and a memory address and generate an internal address signal set to a latched state corresponding to the first edge of the self-timed pulse. Memory devices may further comprise one or more pre-decoders. Memory devices may further comprise one or more registers positioned in the data path to provide memory array design simplification and/or operational consistency. Memory devices may be configured to provide all of the data and write addresses to be available as of a specified edge of the write clock. Memory devices may be configured to provide one or more (e.g., read, etc.) addresses to be available as of a specified signal, such as a specified edge of a signal, of a clock signal, etc. Memory devices may be configured such that one or more of section data is utilized to control memory operations associated with the row and column addresses into/out of the memory, section data is utilized to synchronize memory operations associated with the row and column addresses into/out of the memory, and/or section data is utilized to transfer of clock pulses into/inside the memory. Memory devices may be configured to provide chip addresses/addressing that are 'partially synchronized', such that only some but not all of the chip addressing is synchronized, thereby yielding faster operation, power saving, and/or reduced complexity over existing synchronized addressing regimes.

According to the innovations described herein, methods for operating memory devices (e.g., semiconductor memory devices) may be provided. For example, a method of memory operation may comprise the following processes. A clock signal may be processed. A self-timed pulse generator may generate a self-timed pulse having a first edge corresponding to a rising edge of the clock signal and a second edge. A first input latch circuit may process the self-timed pulse and a memory operation command. The first input latch circuit may generate an internal memory operation command set to a latched state corresponding to the first edge of the self-timed pulse. A read and write control circuit may process the self-timed pulse and internal memory operation signal. The read and write control circuit may perform a read operation and/or a write operation, the read operation being performed corresponding to one of the first edge and second edge of the self-timed pulse, and the write operation being performed corresponding to one of the first edge and second edge of the self-timed pulse. A second input latch circuit may process the self-timed pulse and a memory address. The second input latch circuit may generate an internal address signal set to a latched state corresponding to the first edge of the self-timed pulse. As such, write address timing and/or data timing associated with the write operation may be aligned. In another example, a semiconductor memory device operation method may comprise the following processes. A self-timed pulse generator may receive a clock signal. The self-timed pulse generator may generate a self-timed pulse having a first edge corresponding to a rising edge of the clock signal and a second edge. A first input latch circuit may receive the self-timed pulse and a memory operation command. The first input latch circuit may generate an internal memory operation command set to a latched state corresponding to the first edge of the self-timed pulse. A read and write control circuit may receive the self-timed pulse and internal memory operation signal. The read and write control circuit may perform a read operation and/or a write operation, the read operation being performed corresponding to one of the first edge and second edge of the self-timed pulse, and the write operation being performed corresponding to one of the first edge and second edge of the self-timed pulse. A second input latch circuit may receive the self-timed pulse and a memory address. The second input latch circuit may generate an internal address signal set to a latched state corresponding to the first edge of the self-timed pulse. Again, write address timing and/or data timing associated with the write operation may be aligned.

In embodiments based on any of the aforementioned examples, or in other embodiments, additional features and/or processes may be provided. Performing the read operation may comprise generating a read self-timed pulse. Performing the write operation may comprise generating a write self-timed pulse. Methods may comprise entering, with the first input latch circuit, an unlatched state at a time corresponding to the second edge of the self-timed pulse; and entering, with the second input latch circuit, an unlatched state at a time corresponding to the second edge of the self-timed pulse. Methods may comprise providing, via the section address logic, control to transmit row and column data into. Methods may comprise receiving, with a plurality of second input latch circuits, the self-timed pulse and a memory address; and generating, with the plurality of second input latch circuits, an internal address signal set to a latched state corresponding to the first edge of the self-timed pulse. Methods may comprise providing, via the section address logic, control to transmit row and column data into memory. Methods may comprise providing all of the data and write addresses to be available as of a specified edge of the write clock. Methods may comprise providing all of the read addresses to be available as of a specified edge of the write clock. Methods may comprise utilizing section data to control memory operations associated with the row and column addresses into/out of the memory. Methods may comprise utilizing section data to synchronize memory operations associated with the row and column addresses into/out of the memory. Methods may comprise utilizing section data to transfer clock pulses into/inside the memory. Methods may comprise providing chip addresses/addressing that are 'partially synchronized', such that only some but not all of the chip addressing is synchronized, thereby yielding faster operation, power saving, and/or reduced complexity over existing synchronized addressing regimes.

In addition to the above SRAMs and SRAM architecture, the present inventions also include, inter alia, methods of fabricating SRAM devices consistent with the features and/or functionality herein, products (such as SRAMs or products embodying SRAMs), and products produced via such processes. By way of example and not limitation, methods of such fabrication may include known SRAM manufacturing processes in CMOS technologies involving aspects such as p-mos and n-mos transistor formation, multiple metallization layers and/or local interconnects, among others. A variety of exemplary/staple processes here, for example, being set forth in the backgrounds/disclosures of U.S. Pat. Nos. 4,794,561, 5,624,863, 5,994,178, 6,001,674, 6,117,754, 6,127,706, 6,417,549, 6,894,356, and 7,910,427 as well as U.S. patent application publication No. US2007/0287239A1, which are incorporated herein by reference. For example, a method of fabricating a memory device may comprise forming transistors onto one or more substrates; forming interconnects, including multiple metallization layers and/or interconnects between the transistors; and connecting the transistors and/or other components wherein a memory device consistent with one or more aspects of this disclosure is provided.

As disclosed herein, features consistent with the present inventions may be utilized via and/or involved with computer hardware, software and/or firmware. For example, the systems and methods disclosed herein may be embodied in or used in connection with various forms including, for example, memory, data processors, such as in computing devices that also includes memory, a database, digital electronic circuitry, firmware, software, or in combinations of them. Further, while some of the disclosed implementations describe specific hardware components, systems and methods consistent with the innovations herein may be implemented in the context of any combination of hardware, software and/or firmware. Moreover, the above-noted features and other aspects and principles of the innovations herein may be implemented in various memory environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data/instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media), though does not include transitory media such as carrier waves.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the inventions pertain that variations and modifications of the various implementations shown and described herein may be made without departing from the spirit and scope of the innovations herein. Accordingly, it is intended that the inventions be limited only to the extent required by the applicable rules of law.

The invention claimed is:

1. A semiconductor memory device comprising:
a self-timed pulse generator configured to receive a clock signal and generate a self-timed pulse having a first edge corresponding to a rising edge of the clock signal and a second edge;
first input latch circuitry configured to receive the self-timed pulse and a memory operation command and generate an internal memory operation command set to a latched state corresponding to the first edge of the self-timed pulse;
read/write control circuitry configured to receive the self-timed pulse and internal memory operation signal and perform a read operation and a write operation for at least one memory address, the read operation being performed corresponding to one of the first edge and second edge of the self-timed pulse, and the write operation being performed corresponding to one of the first edge and second edge of the self-timed pulse, wherein the read/write control circuitry is configured to control row and column addresses of the at least one memory address using section address data that is separate from a read pulse during the read operation; and
second input latch circuitry configured to receive the self-timed pulse and a memory address and generate an internal address signal set to a latched state corresponding to the first edge of the self-timed pulse, wherein the section address data is used to synchronize memory operations associated with the row and column addresses propagating into and out of the memory;
wherein the self-timed pulse generator is further configured to adjust a width of the self-timed pulse to ensure the completion of the read operation; and
wherein the read/write control circuitry is configured to align write address timing and data timing associated with the write operation via:
for section addressing operations, multiplexing a read address and a write address using the read pulse and a write pulse;
for row and column addressing operations, multiplexing the read address and the write address using only the write pulse; and
operating a plurality of registers in a write address path and at least one register in a data path, wherein the registers in the write path and the at least one register in the data path align the write address timing and the data timing associated with the write operation.

2. The device of claim 1 wherein improved device performance is provided via a self-timed pulse in the input latch circuitry and/or via associated control/scheme from the control circuitry, the improved performance including one or more of fast address access, improved random access time, and/or minimized cycle time.

3. The device of claim 1 wherein one or both of:
the read operation comprises generating a read self-timed pulse; and
the write operation comprises generating a write self-timed pulse.

4. The device of claim 1 wherein:
the first input latch circuit is further configured to enter an unlatched state at a time corresponding to the second edge of the self-timed pulse; and
the second input latch circuit is further configured to enter an unlatched state at a time corresponding to the second edge of the self-timed pulse.

5. The device of claim 1 wherein a control to transmit row and column data into memory is provided via the section address logic.

6. The device of claim 5 further comprising:
a plurality of second input latch circuits configured to receive the self-timed pulse and a memory address and generate an internal address signal set to a latched state corresponding to the first edge of the self-timed pulse.

7. The device of claim 1 further comprising one or more pre-decoders.

8. The device of claim 1 further comprising one or more registers positioned in the data path to provide memory array design simplification and operational consistency.

9. The device of claim 1 wherein the read/write control circuitry is further configured to provide the at least one memory address to be available as of a specified edge of the write clock.

10. The device of claim 1 and further configured to provide one or more addresses to be available as of a specified signal.

11. The device of claim 1, wherein the first input latch circuitry, second input latch circuitry, and read/write control circuitry are arranged to provide consistent read operation.

12. A method of memory operation, the method comprising:
processing a clock signal;
generating, with a self-timed pulse generator, a self-timed pulse having a first edge corresponding to a rising edge of the clock signal and a second edge;
processing, via a first input latch circuit, the self-timed pulse and a memory operation command;
generating, via the first input latch circuit, an internal memory operation command set to a latched state corresponding to the first edge of the self-timed pulse;
processing, via a read and write control circuit, the self-timed pulse and internal memory operation signal;
performing, via the read and write control circuit, a read operation and a write operation for at least one memory address, the read operation being performed corresponding to one of the first edge and second edge of the self-timed pulse, and the write operation being performed corresponding to one of the first edge and second edge of the self-timed pulse, wherein, during the read operation, row and column addresses of the at least one memory address are controlled using section address data that is separate from a read pulse;
processing, via a second input latch circuit, the self-timed pulse and a memory address, wherein the section address data is used to synchronize memory operations associated with the row and column addresses propagating into and out of the memory;
generating, via the second input latch circuit, an internal address signal set to a latched state corresponding to the first edge of the self-timed pulse; and
adjusting, with the self-timed pulse generator, a width of the self-timed pulse to ensure the completion of the read operation;
wherein write address timing and data timing associated with the write operation are aligned via:
for section addressing operations, multiplexing a read address and a write address using the read pulse and a write pulse;
for row and column addressing operations, multiplexing the read address and the write address using only the write pulse; and
operating a plurality of registers in a write address path and at least one register in a data path, wherein the registers in the write path and the at least one register in the data path align the write address timing and the data timing associated with the write operation.

* * * * *